United States Patent
Chiang

(10) Patent No.: US 10,893,131 B2
(45) Date of Patent: Jan. 12, 2021

(54) CASE FOR A MOBILE ELECTRONIC DEVICE

(71) Applicant: POPSOCKETS LLC, Boulder, CO (US)

(72) Inventor: Randy Yang Chiang, Boulder, CO (US)

(73) Assignee: POPSOCKETS LLC, Boulder, CO (US)

( * ) Notice: Subject to any disclaimer, the term of this patent is extended or adjusted under 35 U.S.C. 154(b) by 0 days.

(21) Appl. No.: 16/225,700

(22) Filed: Dec. 19, 2018

(65) Prior Publication Data

US 2019/0215387 A1 Jul. 11, 2019

Related U.S. Application Data

(60) Provisional application No. 62/614,990, filed on Jan. 8, 2018.

(51) Int. Cl.
| | | |
|---|---|---|
| *H04M 1/02* | (2006.01) | |
| *H04M 1/04* | (2006.01) | |
| *G06F 1/16* | (2006.01) | |
| *H05K 5/02* | (2006.01) | |
| *H05K 5/03* | (2006.01) | |
| *H04M 1/18* | (2006.01) | |
| *H04B 1/3888* | (2015.01) | |

(52) U.S. Cl.
CPC .......... *H04M 1/026* (2013.01); *G06F 1/1656* (2013.01); *H04M 1/0279* (2013.01); *H04M 1/04* (2013.01); *H05K 5/023* (2013.01); *H05K 5/03* (2013.01); *G06F 2200/1633* (2013.01); *H04B 1/3888* (2013.01); *H04M 1/185* (2013.01)

(58) Field of Classification Search
CPC ...... H04M 1/0279; H04M 1/02; H04M 1/026; H04M 1/185; H04M 1/18; H04M 1/04; H05K 5/03; H05K 5/02; G06F 1/16; G06F 1/1656; H04B 1/385; H04B 1/3888; H04B 2001/3861
USPC ....................................................... 455/575.1
See application file for complete search history.

(56) References Cited

U.S. PATENT DOCUMENTS

| | | | | |
|---|---|---|---|---|
| 8,560,031 | B2 * | 10/2013 | Barnett | F16M 13/00 455/575.8 |
| 9,680,515 | B2 * | 6/2017 | Pan | H04B 1/385 |
| 2012/0329534 | A1 * | 12/2012 | Barnett | G06F 1/1626 455/575.8 |
| 2014/0243054 | A1 * | 8/2014 | LaColla | H04M 1/04 455/575.8 |
| 2015/0061477 | A1 * | 3/2015 | Wilson | G06F 1/1633 312/223.1 |
| 2015/0111623 | A1 * | 4/2015 | Hegemier | B44C 1/105 455/575.1 |
| 2015/0141090 | A1 * | 5/2015 | Hwan | H04M 1/185 455/575.8 |

(Continued)

OTHER PUBLICATIONS

International Application No. PCT/US2018/066348, International Search Report and Written Opinion, dated Feb. 22, 2019.

*Primary Examiner* — Khawar Iqbal
(74) *Attorney, Agent, or Firm* — Irell and Manella, LLP

(57) ABSTRACT

A protective case for a mobile electronic device includes a case body and a protection element. The case body is sized to receive a mobile electronic device. The protection element can be coupled to the case body and include a chamber filled with air.

20 Claims, 4 Drawing Sheets

(56) References Cited

U.S. PATENT DOCUMENTS

| | | | |
|---|---|---|---|
| 2015/0177147 A1* | 6/2015 | Mangan | G02B 21/0008 |
| | | | 250/432 R |
| 2015/0257287 A1* | 9/2015 | Tages | A45C 11/00 |
| | | | 224/191 |
| 2016/0013826 A1* | 1/2016 | Pan | H04B 1/3888 |
| | | | 455/575.6 |
| 2016/0013828 A1* | 1/2016 | Pan | H04B 1/385 |
| | | | 455/575.6 |
| 2016/0065262 A1* | 3/2016 | Wilson | G06F 1/1633 |
| | | | 455/575.8 |
| 2016/0262513 A1 | 9/2016 | O'Neill | |
| 2016/0286921 A1* | 10/2016 | Northrup | A45C 11/00 |
| 2017/0041037 A1* | 2/2017 | Witter | B65D 81/022 |
| 2019/0013832 A1* | 1/2019 | Mody | H04B 1/3888 |
| 2019/0089822 A1* | 3/2019 | Gartz | F16M 11/105 |
| 2019/0211966 A1* | 7/2019 | Nahum | A45C 11/00 |
| 2019/0280727 A1* | 9/2019 | Gehlhausen | H04M 1/04 |

* cited by examiner

CASE FOR A MOBILE ELECTRONIC DEVICE

CROSS-REFERENCE TO RELATED APPLICATIONS

Priority is claimed to U.S. Provisional Application No. 62/614,990, filed Jan. 8, 2018, the entire contents of which are hereby incorporated herein by reference.

FIELD OF THE DISCLOSURE

The present disclosure relates to accessories for mobile electronic devices, and particularly, a case for a mobile electronic device that maximizes protection of the mobile electronic device.

BACKGROUND

Protective cases for mobile electronic device are almost as ubiquitous as mobile electronic devices themselves. Many protective cases are highly aesthetic, serving a very minor protective function. Others, however, are ruggedly designed to protect against relatively high impact events.

SUMMARY

One aspect of the present disclosure is directed to a protective case for a mobile electronic device. The protective case can include a case body sized to receive a mobile electronic device, and a protection element coupled to the case body. The protection element can include a chamber filled with air.

DETAILED DESCRIPTION

The present disclosure relates to cases for mobile electronic devices (e.g., smartphones, tablet computers, electronic readers, digital media players, cameras, and other mobile electronic devices). The cases disclosed herein generally include a case body sized to receive and protect one of these mobile electronic devices and a protection element that is coupled to the case body to protect the case body and the mobile electronic device disposed therein. The protection element can be removably coupled to the case body, thereby forming a two-piece case, or can be permanently coupled to or integrally formed with the case body, thereby forming a one-piece case. The protection element generally includes one or more chambers filled with air and disposed along at least a portion of the perimeter edge and/or rear surface of the case body. Thus, the protection element provides an exterior surface that is a distance from the perimeter edge and/or the rear surface of the case body. Accordingly, in the event the mobile electronic device is dropped or otherwise is subjected to a force that could damage the device, the protection element acts as an air bag, an air cushion, or a shock absorber that provides additional protection beyond the protection already offered by the case body itself.

Figure 1:
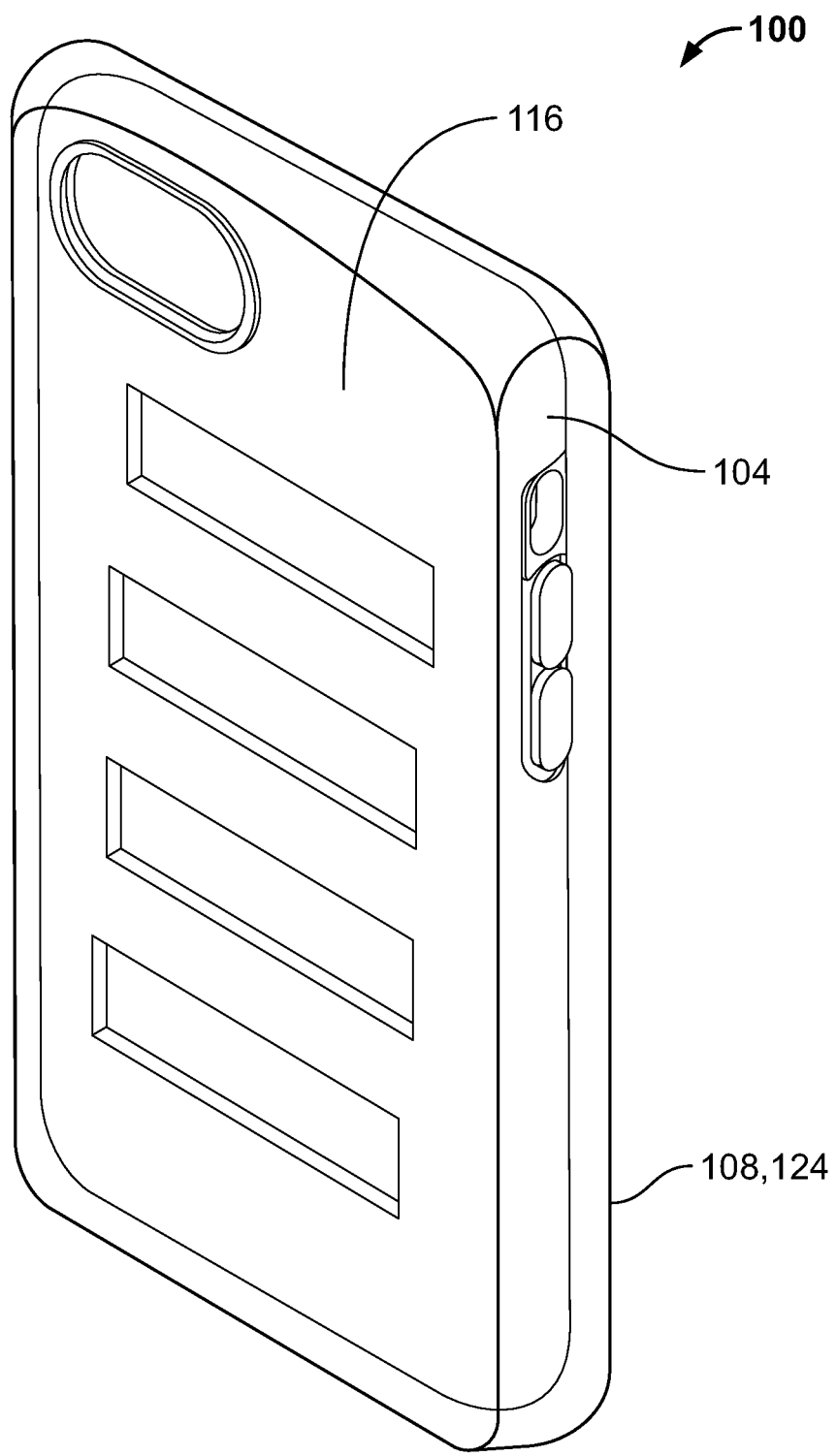
FIG. 1 is a rear perspective view of one example of a case for a mobile electronic device constructed in accordance with the teachings of the present disclosure.
Figure 2:
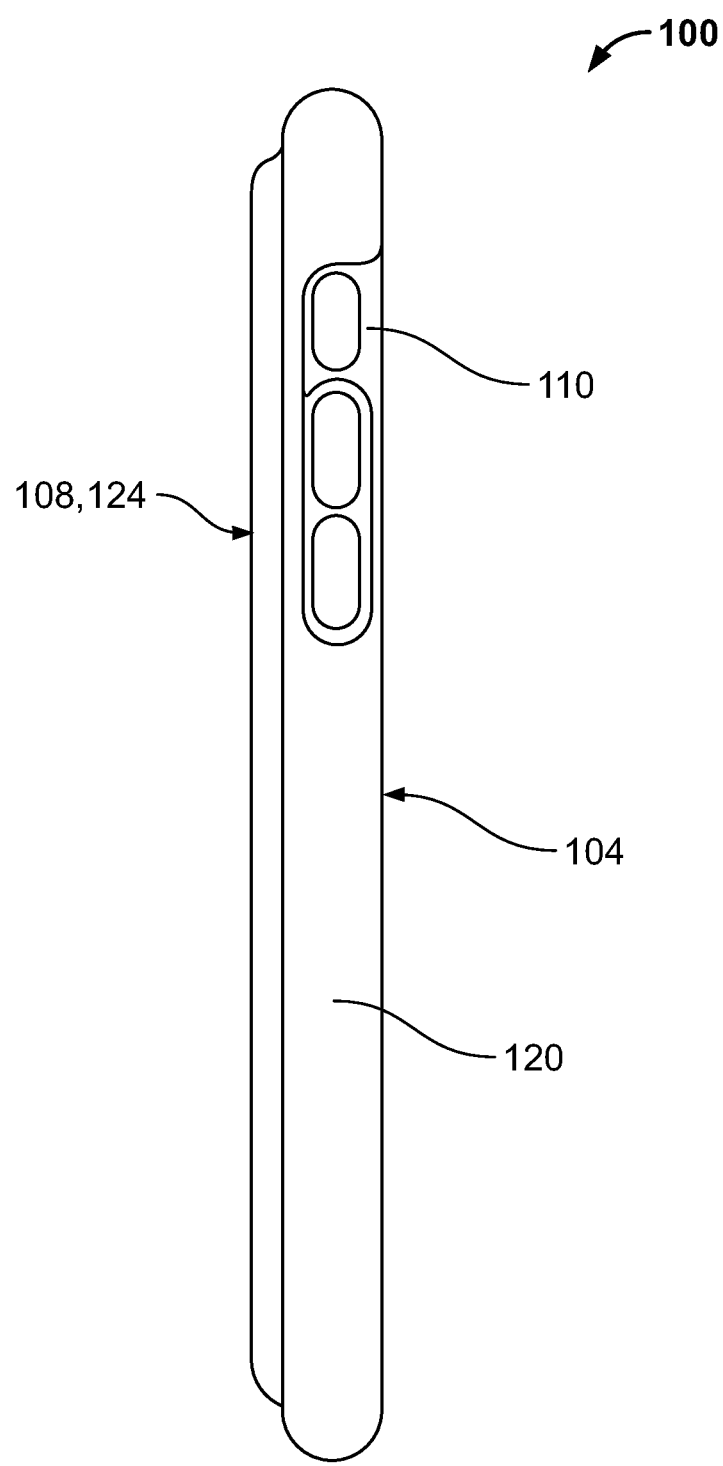
FIG. 2 is a side view of the case of FIG. 1.

FIGS. 1 and 2 illustrate one example a case 100 constructed in accordance with the present disclosure. The case 100 in this example generally includes a case body 104 and a protection element 108 coupled to the case body 104.

In this example, the case body 104 is made from a material such as a thermoplastic elastomer (e.g., thermoplastic polyurethane (TPU)) or a thermoplastic polymer like polycarbonate, polyethylene, and the protection element 108 is made from TPU. In other examples, however, the case body 104 may instead be made of a soft, flexible material like silicone or may be made of some other suitable material. Moreover, the protection element 108 may be made from one or more different materials. In this example, the case body 104 and the protection element 108 are separately manufactured and then adhered or otherwise fixedly coupled to one another, thereby forming a unitary case. In other examples, the case body 104 and the protection element 108 may instead be integrally formed with one another, again forming a unitary case, or may be separately manufactured and then removably coupled to one another, thereby forming a removable two-part case. The above-described examples may be produced using any known manufacturing techniques, e.g., blowmolding, roto molding, overmolding, or co-molding.

The case body 104 is generally sized to receive a mobile electronic device, e.g., the smartphone 110. While the exact size and shape of the case body 104 may vary, the case body 104 generally has a front surface (not shown), a rear surface 116 opposite the front surface, and a perimeter edge 120 that extends outward from the front surface, away from the rear surface 116. The front surface and the perimeter edge 120 define a cavity (not shown) that is sized to receive and retain the smartphone 110. When the smartphone 110 is disposed in the cavity, the perimeter edge 120 of the case body 104 at least partially covers a perimeter edge of the smartphone 110, thereby protecting the perimeter edge of the smartphone 110, and the display of the smartphone 110, from damage.

The protection element 108 is generally configured to provide additional protection to the smartphone 110 (or other mobile electronic device) beyond what is provided by the case body 104. The protection element 108 in this example generally includes a chamber 124 that is filled with air (or another suitable gas or fluid), though in other examples, the protection element 108 can include multiple chambers filled with air and/or one or more chambers filled with a different fluid. The protection element 108 in this example is positioned so that the chamber 124 entirely covers the rear surface 116 and entirely surrounds the perimeter edge 120 of the case body 104. Thus, the protection element 108 in this example includes a generally planar portion on the rear surface 116 of the case body 104 and a plurality of rib-like portions covering the perimeter edge 120. Collectively, these various portions of the protection element 108 provide or define an exterior contact surface that is disposed at a distance from the rear surface 116 and the perimeter edge 120 of the case body 104, such that any force generated during use of the smartphone 110 (e.g., by dropping the smartphone 110) would be applied to this exterior contact surface at a distance from the smartphone 110.

Figure 3:
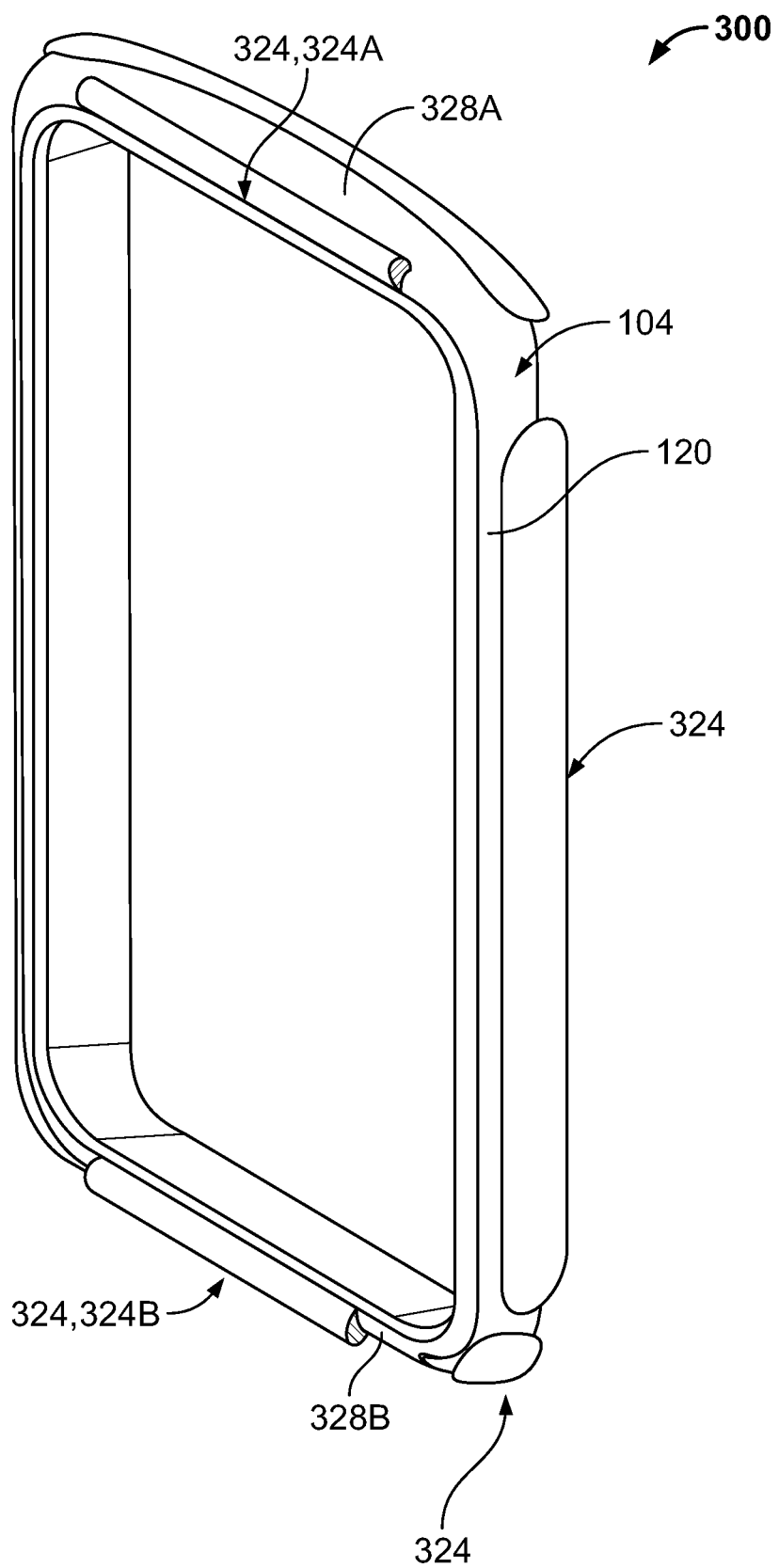
FIG. 3 is a front perspective view of another example of a case for a mobile electronic device constructed in accordance with the teachings of the present disclosure.

FIG. 3 illustrates another example of a case 300 for a mobile electronic device (e.g., the smartphone 110) constructed in accordance with the present disclosure. The case 300 in this example is similar to the case 100, in that it includes the case body 104, but the case 300 differs in that it includes a protection element 308 that is different from the protection element 108. Unlike the protection element 108, the protection element 308 takes the form of a plurality of separate chambers 324, each filled with air (or another suitable gas or fluid), and generally disposed at or along the areas of the case body 104 most susceptible to damage that would also damage the smartphone 110. More particularly, the chambers 324 are disposed and spaced apart from one another along the perimeter edge 120 of the case body 104. As an example, a first chamber 324A includes a rib-like shape and is disposed along a top portion 328A of the perimeter edge 120, while a second chamber 324B includes a rib-like shape and is disposed along a bottom portion 328B of the perimeter edge 120 opposite the top portion 328A. In other versions, the case 300 could have additional separate chambers strategically positioned to achieve a functional and/or aesthetic objective. For example, in some versions, the case 300 could include one or more chambers on a surface of the case body 104 in the shape of any particular design, logo, alphanumeric symbol, icon, image, shape, etc. Such a chamber could not only serve to protect, but could be used to deliver a message or display branding.

Figure 4:
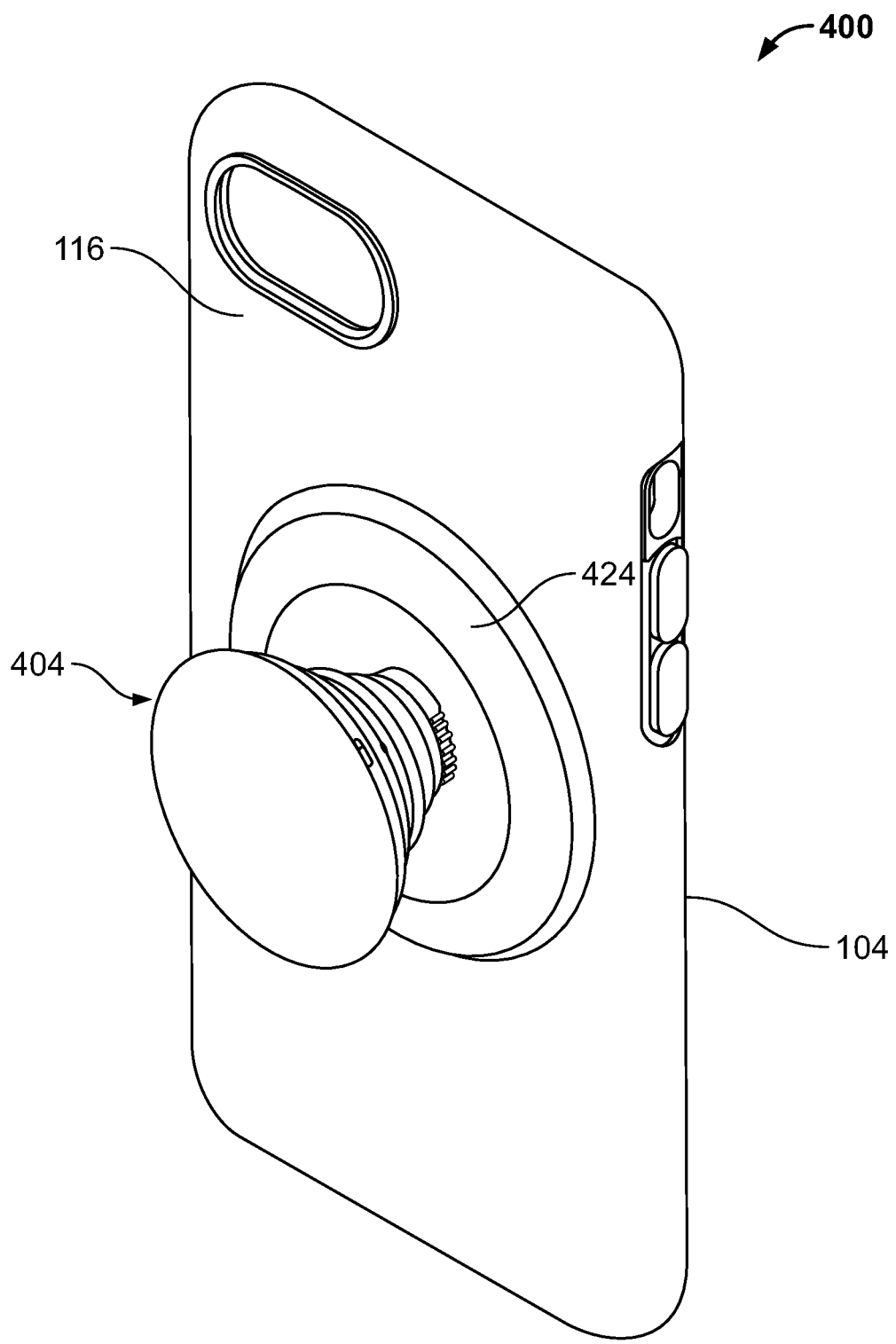
FIG. 4 is a rear perspective view of another example of a case for a mobile electronic device constructed in accordance with the teachings of the present disclosure.

FIG. 4 illustrates another example of a case 400 for a mobile electronic device (e.g., the smartphone 110) constructed in accordance with the present disclosure. The case 400 in this example is similar to the case 100, in that it includes the case body 104, but the case 400 differs in two respects. First, the case 400 includes a protection element 408 that differs from the protection element 108. More particularly, the protection element 408 in this example takes the form of a single chamber 424 that is locally coupled to a portion of the rear surface 116 of the case body 104. The chamber 424 has a circular shape, though the chamber 424 may instead have a rectangular, triangular, hexagonal, oval, irregular, or other shape. The chamber 424 may be centrally located on the rear surface 116 of the case body 104, as shown in FIG. 4, or located elsewhere on or along the rear surface 116 of the case body 104. Second, the case 400 also includes an expandable grip accessory 404 that may be removably attached to, permanently attached to, or integrally formed with the chamber 424 or case body 104. Further description of such expandable grip accessories 404, which can be used, for example, as a docking accessory and for use as a grip and stand for a mobile electronic device, can be found in commonly owned U.S. Pat. No. 8,560,031, the entire disclosure of which is hereby incorporated by reference herein.

Based on the foregoing it should be appreciated that the present disclosure provides various examples of protective cases for mobile electronic devices. But it should further be appreciated that the foregoing disclosure is not limited to the examples expressly described and/or depicted, but rather, is intended to include all modifications, variations, combinations, or other changes that fall within the spirit and scope of the following claims.

The invention claimed is:

1. A protective case for a mobile electronic device, the protective case comprising:
a case body sized to receive a mobile electronic device, wherein the case body has a front surface arranged to engage the mobile electronic device, a rear surface opposite the front surface, and a perimeter edge extending outward from the front surface and away from the rear surface; and
a protection element coupled to the rear surface of the case body and configured to define an exterior contact surface that is disposed at a distance from the rear surface and the perimeter edge for protecting the case body and the mobile electronic device, the protection element comprising:
a first chamber filled with a fluid, the first chamber centrally located on the rear surface of the case body, such that the first chamber covers a portion of the rear surface of the case body.

2. The protective case of claim 1, wherein the protection element is integrally formed with the case body.

3. The protective case of claim 1, wherein the protection element is removably coupled to the case body.

4. The protective case of claim 1, wherein the case body is made from a first material and the protection element is made from a second material.

5. The protective case of claim 1, wherein the protection element is manufactured using blowmolded thermoplastic polyurethane (TPU).

6. The protective case of claim 1, wherein the protection element comprises a plurality of chambers filled with a gas or a liquid.

7. The protective case of claim 1, wherein the protection element covers an entirety of the rear surface of the case body.

8. The protective case of claim 1, wherein the protection element further comprises a second chamber that forms a portion of the perimeter edge of the protective case.

9. The protective case of claim 8, wherein the protection element forms an entirety of the perimeter edge of the protective case.

10. The protective case of claim 8, wherein the second chamber is fluidly isolated from the first chamber.

11. The protective case of claim 1, further comprising an expandable grip accessory coupled to the case body or the protective element.

12. The protective case of claim 11, wherein the expandable grip accessory is coupled to the protective element.

13. The protective case of claim 11, wherein the expandable grip accessory comprises:
a base;
a button spaced relative to the base, wherein the button is movable relative to the base.

14. The protective case of claim 13, wherein the expandable grip accessory further comprises a skin coupled to the base, wherein the button is coupled to the skin opposite the base, and wherein the skin is deformable between a collapsed configuration and an expanded configuration.

15. A protective case for a mobile electronic device, the protective case comprising:
a case body sized to receive a mobile electronic device, wherein the case body has a front surface arranged to engage the mobile electronic device, a rear surface opposite the front surface, and a perimeter edge extending outward from the front surface and away from the rear surface;
a protection element coupled to the rear surface of the case body and configured to define an exterior contact surface that is disposed at a distance from the rear surface and the perimeter edge for protecting the case body and the mobile electronic device, the protection element comprising:

a first chamber filled with a fluid, the first chamber centrally located on the rear surface of the case body, such that the first chamber covers a portion of the rear surface of the case body; and an expandable grip accessory coupled to an outer surface of the first chamber.

16. The protective case of claim 15, wherein the expandable grip accessory comprises:

a base;

a button spaced relative to the base, wherein the button is movable relative to the base.

17. The protective case of claim 16, wherein the expandable grip accessory further comprises a skin coupled to the base, wherein the button is coupled to the skin opposite the base, and wherein the skin is deformable between a collapsed configuration and an expanded configuration.

18. The protective case of claim 15, wherein the protection element further comprises a second chamber that forms a portion of a perimeter edge of the protective case.

19. A protective case for a mobile electronic device, the protective case comprising:

a case body sized to receive a mobile electronic device, wherein the case body has a front surface arranged to engage the mobile electronic device, a rear surface opposite the front surface, and a perimeter edge extending outward from the front surface and away from the rear surface;

a protection element coupled to the rear surface of the case body and configured to define an exterior contact surface that is disposed at a distance from the rear surface and the perimeter edge for protecting the case body and the mobile electronic device, the protection element comprising a single chamber filled with a fluid, the single chamber centrally located on the rear surface of the case body, such that the single chamber covers a portion of the rear surface of the case body; and an expandable grip accessory directly coupled to an outer surface of the single chamber, wherein the expandable grip accessory comprises:

a base;

a button spaced relative to the base, wherein the button is movable relative to the base; and a skin coupled to the base, wherein the button is coupled to the skin opposite the base, and wherein the skin is deformable between a collapsed configuration and an expanded configuration.

20. The protective case of claim 19, wherein the base of the expandable grip accessory is directly coupled to the outer surface of the single chamber.

\* \* \* \* \*